United States Patent

Hunton et al.

[15] 3,678,395

[45] July 18, 1972

[54] BROADBAND PLANAR BALANCED CIRCUIT

[72] Inventors: James Keith Hunton, Los Altos; Wayne M. Kelly, Sunnyvale; James S. Takeuchi, Belmont, all of Calif.

[73] Assignee: GTE Sylvania Incorporated

[22] Filed: Oct. 14, 1970

[21] Appl. No.: 79,906

[52] U.S. Cl. ..........................325/446, 332/84 M, 332/43 B, 321/69 R

[51] Int. Cl. ..........................H03c 1/58, H04b 1/26

[58] Field of Search ..........................325/446; 333/84 M, 84 R; 332/43 B, 44, 24.1; 321/69 R, 69 W; 317/234 R

[56] References Cited

UNITED STATES PATENTS

| | | | |
|---|---|---|---|
| 3,512,091 | 5/1970 | Blixt et al. | 325/446 |
| 3,568,105 | 3/1971 | Falsenheld | 333/84 |
| 3,391,346 | 7/1968 | Uhlir, Jr. | 321/69 |
| 3,374,404 | 3/1968 | Luecke | 317/234 |
| 3,310,748 | 5/1967 | Putnam | 325/446 |
| 3,560,893 | 2/1971 | Wen | 333/24.1 |
| 3,602,845 | 8/1971 | Agrios | 333/84 |

*Primary Examiner*—Robert L. Griffin
*Assistant Examiner*—Peter M. Pecori
*Attorney*—Norman J. O'Malley, John F. Lawler and Russell A. Cannon

[57] ABSTRACT

A broadband planar balanced circuit comprising the junction of slot-line and coplanar-line transmission media. The coplanar and slot lines are formed on one side of a conductively covered dielectric sheet or substrate and are axially aligned. Integrated circuit diodes are connected across the junction and react with microwave energy propagating to the junction along the coplanar and slot lines. The intersection of these two lines has the characteristics of a hybrid junction necessary for the realization of microwave integrated circuit balanced mixers and is also applicable to broadband integrated circuit balanced frequency multipliers.

12 Claims, 9 Drawing Figures

INVENTORS
JAMES KEITH HUNTON
WAYNE M. KELLY
JAMES S. TAKEUCHI

BY John F. Lawler
ATTORNEY

INVENTORS
JAMES KEITH HUNTON
WAYNE M. KELLY
JAMES S. TAKEUCHI

BY John F. Lawler
ATTORNEY

INVENTORS
JAMES KEITH HUNTON
WAYNE M. KELLY
JAMES S. TAKEUCHI

BY John F. Lawler
ATTORNEY

BROADBAND PLANAR BALANCED CIRCUIT

BACKGROUND OF THE INVENTION

This invention relates to planar balanced circuits and more particularly to a planar transmission line junction for broadband microwave integrated circuit mixers and frequency multipliers.

Microwave balanced mixers capable of broadband operation have been difficult to construct in integrated circuit form. A principal reason for this difficulty is the inability to form hybrid junctions which are compatible with the microstrip type of transmission line used for such integrated circuit mixers.

Accordingly, it is an object of this invention to provide a broadband transmission line junction useful for microwave balanced mixers in integrated circuit form.

Another object of the invention is the provision of a microwave integrated circuit balanced mixer having a broad operating bandwidth.

A further object is the provision of a planar circuit junction useful in the construction of balanced frequency multipliers.

SUMMARY OF THE INVENTION

We have discovered that a junction between a slot line and a coplanar line uniquely has the necessary characteristics of a psuedo hybrid junction useful in microwave balanced mixers. A local oscillator (L.O.) signal input to the coplanar line remote from the junction propagates to the junction and no further. The radio frequency (R.F.) input signal coupled at right angles to the slot line propagates to the junction and beyond but not further than the end of the coplanar line which presents a short circuit to that signal. Switching diodes and capacitors formed by integrated circuit techniques at the junction permit the intermediate frequency (I.F.) signal to be derived from the junction for transmission to appropriate external circuitry. This junction concept is equally applicable to the realization of balanced frequency multipliers and provides effective separation of odd and even harmonics for broadband operation.

DESCRIPTION OF PREFERRED EMBODIMENT

Figure 1:
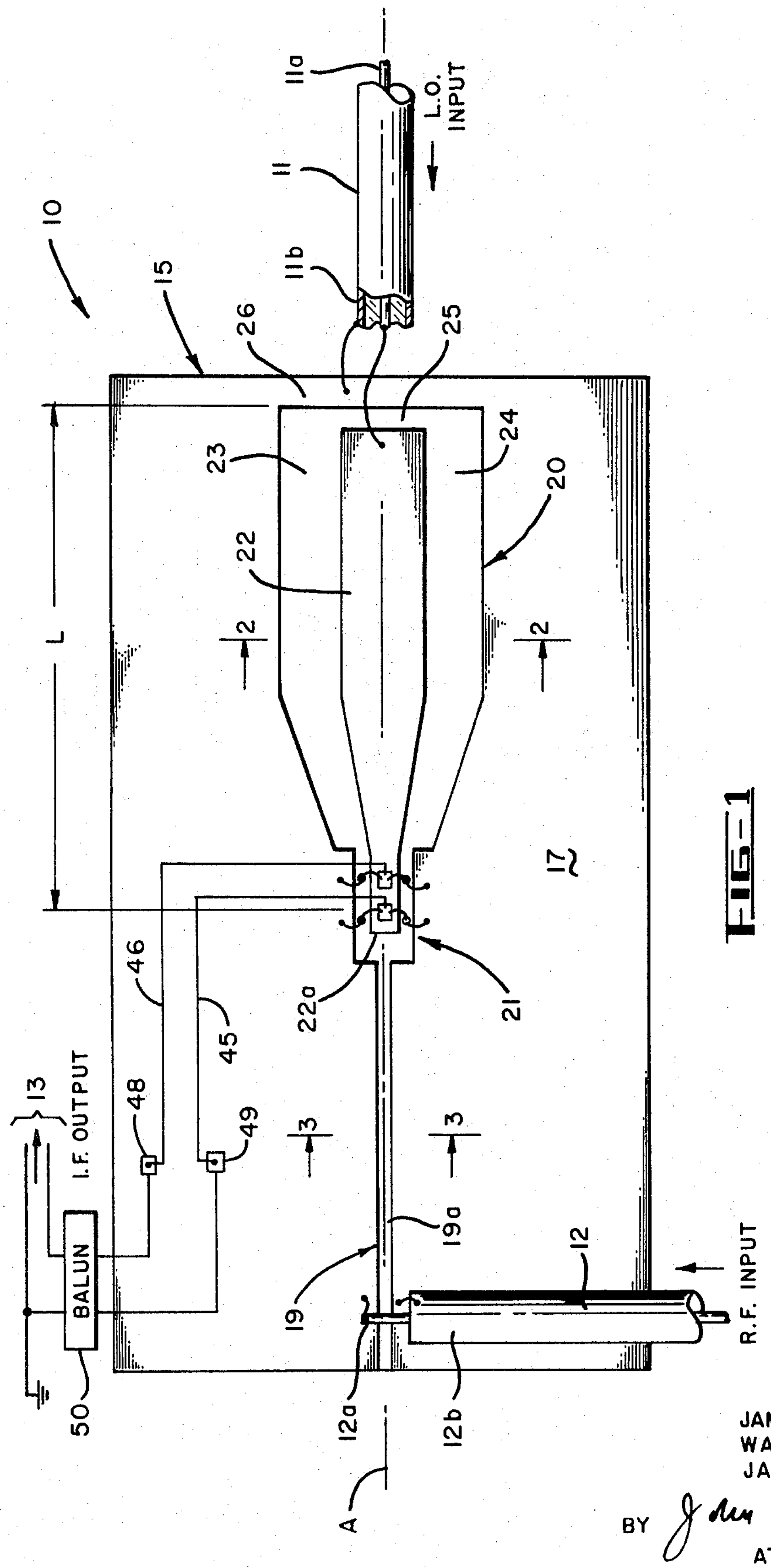
FIG. 1 is a schematic plan view of a balanced mixer embodying the invention.

Referring now to the drawings, FIG. 1 illustrates schematically a balanced mixer circuit 10 having an input line 11 carrying the L.O. signal, another input line 12 carrying the R.F. signal, and an output line 13 carrying the I.F. signal derived from the mixing of the two input signals. The mixing function is performed by means of a laminar body 15 consisting of a planar dielectric sheet or substrate 16, see FIGS. 2 and 3, having a thin conductive layer 17 formed on one surface thereof; this body provides the base for the formation of a slot transmission line 19 and a coplanar transmission line 20 which intersect at a junction 21 to provide the unique mixing action as described below. By way of example, conductive layer 17 may be a chrome-gold metalization deposit and the substrate 16 may be a sheet of magnesium titanate approximately 0.080 inch thick and having a dielectric constant of 16.

Figure 3:
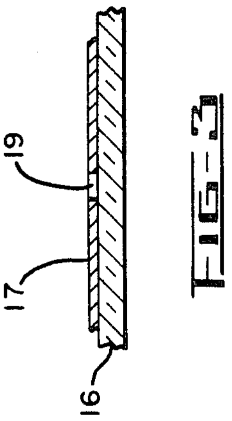
FIG. 3 is a section taken on line 3—3 of FIG. 1.

Slot line 19 consists of a slot 19*a*, see FIG. 3, extending through conductive layer 17 and along an axis A. For R.F. microwave signals in L and S bands, slot 19*a*, by way of example, may have a width of 0.012 inch. The R.F. input line 12 is a coaxial line extending at right angles to slot line axis A and having its inner conductor 12*a* and outer conductor 12*b* connected on opposite sides, respectively, of slot 19*a* as shown. Energy propagating along the unbalanced input line 12 is coupled into the slot line 19*a* and propagates therealong toward junction 21 as a balanced signal.

Figure 2:
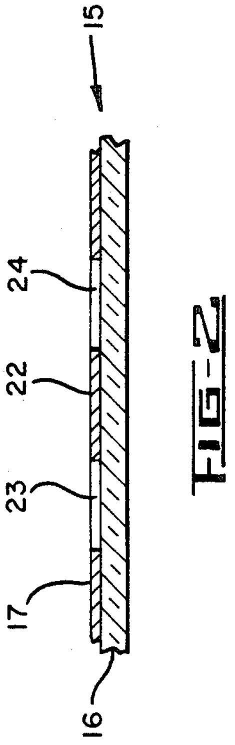
FIG. 2 is a section taken on line 2—2 of FIG. 1, the thickness of the substrate and conductive film being somewhat exaggerated for clarity of the description.

Coplanar line 20 comprises a center strip portion 22 of conductive layer 17 extending along axis A and defined on opposite sides by axially parallel grooves 23 and 24, see FIG. 2, and on the end remote from the junction by transverse groove 25, which grooves extend through conductive layer 17 to substrate 16 and separate the center strip from the ground plane conductors on opposite sides thereof. A transverse conductive strip 26 across the end of coplanar line 20 acts as a short circuit to R.F. waves propagating away from junction as explained below. Center strip 22 and grooves 23 and 24 taper to narrower dimensions adjacent junction 21 where the latter grooves intersect with slot 19*a* and the inner end 22*a* of center strip 22 extends into the junction area spaced from the end of the slot line as shown. By way of example, the width of center strip 22 at the L.O. input end for L and S band frequencies may be 0.040 inch, the width of grooves 23 and 24 approximately 0.033 inch, the dimension L about 0.345 inch and the axial length of junction 21 equal to 0.090 inch.

The construction of the slot line and the coplanar line is known in the prior art and does not per se constitute this invention. The slot line is described in an article entitled "Slotline—An Alternative Transmission Medium for Integrated Circuits" by S. B. Cohn, IEEE G-MTT International Microwave Symposium Digest, pages 104–109, May 1968; the coplanar line is described in an article titled "Coplanar waveguide, A Surface Strip Transmission Line Suitable for Non-reciprocal Gyromagnetic Device Applications," by Cheng P. Wen, IEEE G-MTT International Microwave Symposium Digest, pages 110–115, May 1969.

L.O. input line 11 is a coaxial line having a center conductor 11*a* connected to center strip 22 and an outer conductor 11*b* connected to transverse strip 26. The input from line 11 is an unbalanced signal which propagates along coplanar line 20 to junction 21, beyond which it cannot propagate because of the geometry of the slot line. The R.F. signal, however, propagates from slot line 19 through junction 21 and through coplanar line 20 (in a balanced mode) to transverse strip 26 which acts as a short circuit to this signal. The balanced mode impedance of coplanar line 20 preferably is high, however, and a broad frequency range in the order of 4:1 is readily achievable with a shorted section one-quarter wavelength long at midpoint of the operating frequency range; i.e., where the length L of the coplanar line measured from the midpoint of junction 21 to shorting strip 26 is one-quarter wavelength at mid band.

Figures 4, 5:
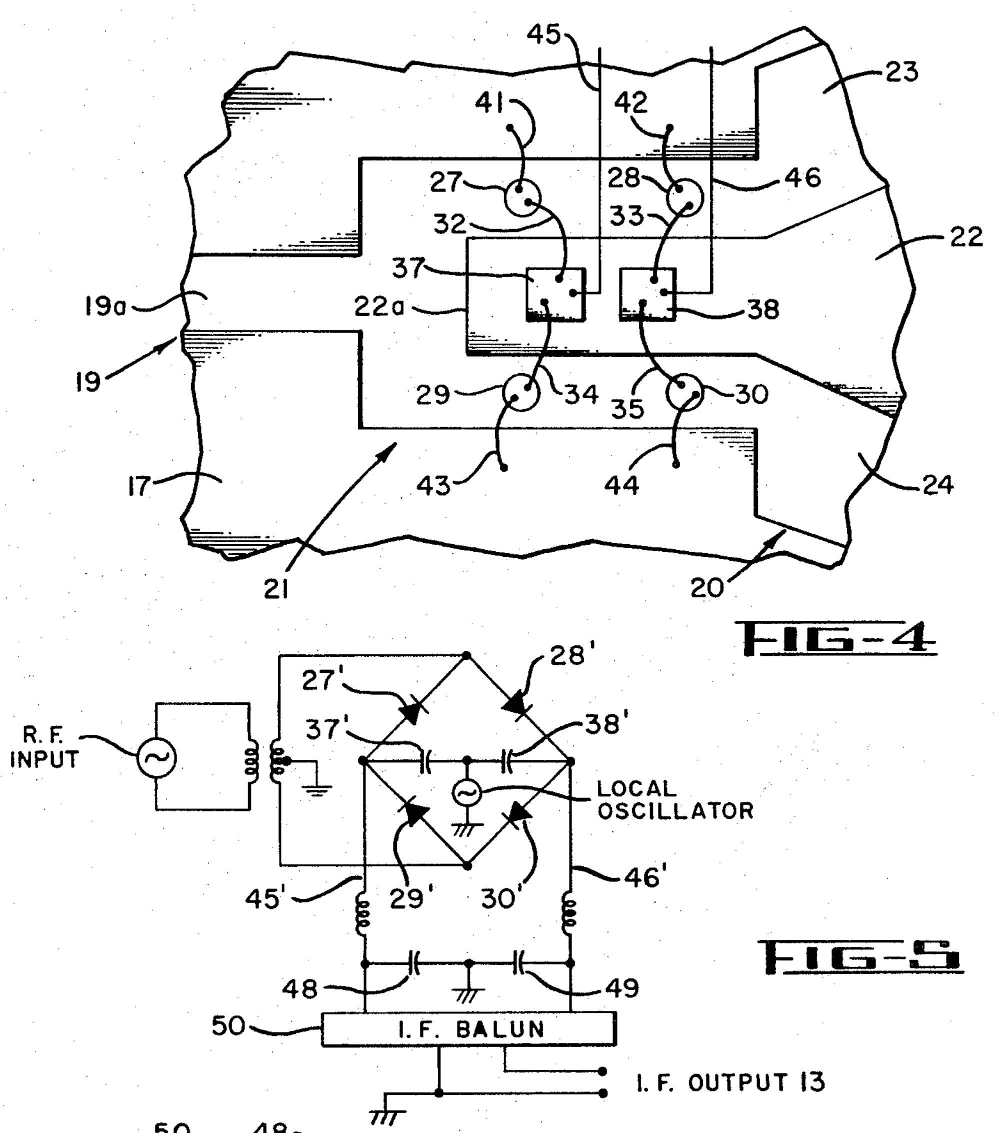
FIG. 4 is a greatly enlarged view of the junction of the coplanar and slot lines in FIG. 1.
FIG. 5 is a schematic view of an equivalent circuit corresponding to the mixer of FIG. 1.

Junction 21 of slot line 19 and coplanar line 20 has the characteristics of a hybrid junction that are required to permit realization of a balanced mixer over a wide frequency range with minimum conversion losses. To achieve this function, diodes 27, 28, 29, and 30, see FIG. 4, are connected by leads 32, 33, 34, and 35, respectively, to capacitors 37 and 38 which couple the diodes to the local oscillator voltage on center conductor or strip 22 of the coplanar line. The remaining electrodes of diodes 27 and 28 are connected by leads 41 and 42 to one side of slot line 19 and corresponding electrodes of diodes 29 and 30 are connected by leads 43 and 44 to the opposite side of the slot line. The I.F. signal is removed by leads 45 and 46 connected to capacitors 37 and 38 as shown. The diodes and capacitors are formed by integrated circuit techniques for maximum operating and space utilizing efficiency at minimum cost.

An equivalent circuit of the balanced mixer shown in FIGS. 1 and 4 is represented in FIG. 5 wherein like components are represented by the primes of like reference characters. The diode ring functions as a double-pole double-throw switch, driven by the local oscillator voltage which alternately connects the R.F. signal terminals to the I.F. terminals with opposite polarities. The signal voltage appearing across the slot is connected directly to the terminals of the diode ring. The I.F. signal, which is a balanced voltage across the two capacitors 37' and 38', is removed through inductive leads 45' and 46' and filter capacitors 48' and 49' to balun 50' for connection to associated utilization circuits.

Figure 6:
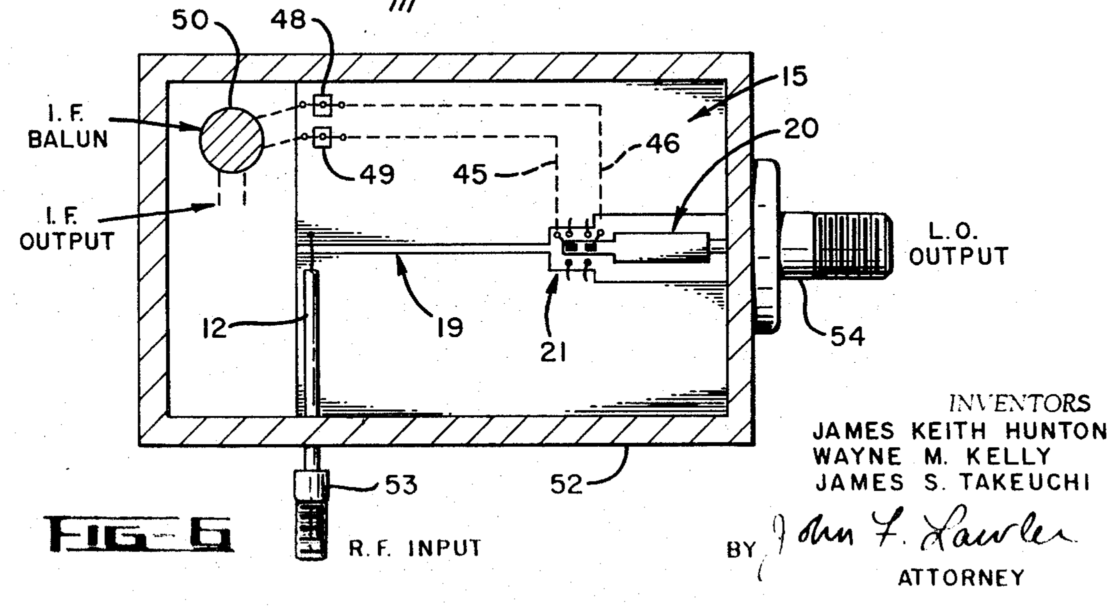
FIG. 6 is a plan schematic view of a balanced mixer actually constructed in accordance with this invention.

A microwave integrated circuit balanced mixer embodying the invention was actually constructed in the form shown in FIG. 6 wherein the substrate body 15 is assembled in a conductive housing 52 and external connectors 53 and 54 mounted on the housing provide electrical connection to the R.F. and L.O. input lines 12 and 11, respectively. In other respects, the circuit of FIG. 6 is substantially the same as that shown in FIG. 1 and like reference characters indicate like parts on the drawings. Four beam-lead Shottky barrier diodes (made by Sylvania Electric Products, Inc.) are connected at junction 21 and the coupling and filter capacitors are fabricated on a silicon base with silicon dioxide dielectric, the metalized contacts thereof also serving as bonding pads for the diodes and I.F. connections. The I.F. connecting leads 45 and 46 are brought out through holes in the dielectric substrate to filter inductors located on the opposite side. Connections from the other ends of leads 45 and 46 are brought up through the substrate to additional filter capacitors 48 and 49 beyond the end of the slot line for connection to a ferrite toroidal I.F. balun 50. This circuit has the essential characteristics of a doubly balanced mixer provided the I.F. frequency is much lower than the R.F. frequency band. The R.F. port is considered to be terminated at all frequencies in the generator resistance while the I.F. port is resistively terminated only at the I.F. being short-circuited for all other frequencies. The minimum "ideal" conversion loss is $\pi^2/4$ or 3.92 db, assuming perfect square-wave switching of the diodes.

Figure 7:
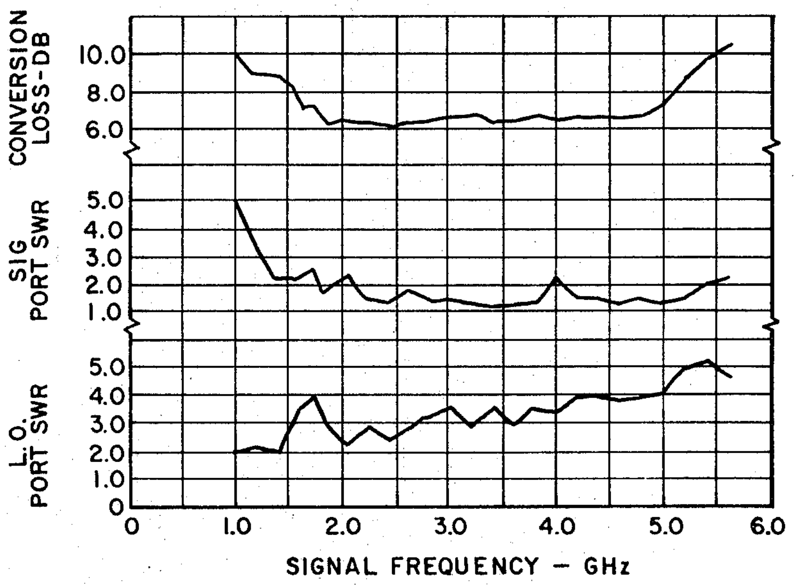
FIG. 7 depicts sets of curves illustrating the performance of the mixer shown in FIG. 6.

The data plotted in FIG. 7 shows the performance of the double-pole double-throw four-diode mixer of FIG. 6 with 10 mw incident L.O. power and an I.F. load resistance of 70 ohms, and indicates a frequency range capability of 4:1 with a 6.5 to 7.0 db conversion loss. The main bandwidth limiting factor is the shorted line stub of the coplanar line 20 which terminates the balanced R.F. port. The stub has a relatively high impedance by comparison with the R.F. drive impedance at the diode ring.

The balanced mixer embodiment of the invention illustrates one application wherein the L.O. signal is connected to the coplanar line 20 and the R.F. signal to the slot line. It should be understood that these connections may be reversed if required or desired and the advantages of the invention realized provided the I.F. output connections are appropriately changed, i.e., four I.F. leads are connected to as many capacitors to which one set of electrodes of the four diodes, respectively, are coupled to the ground plane.

Figures 8, 9:
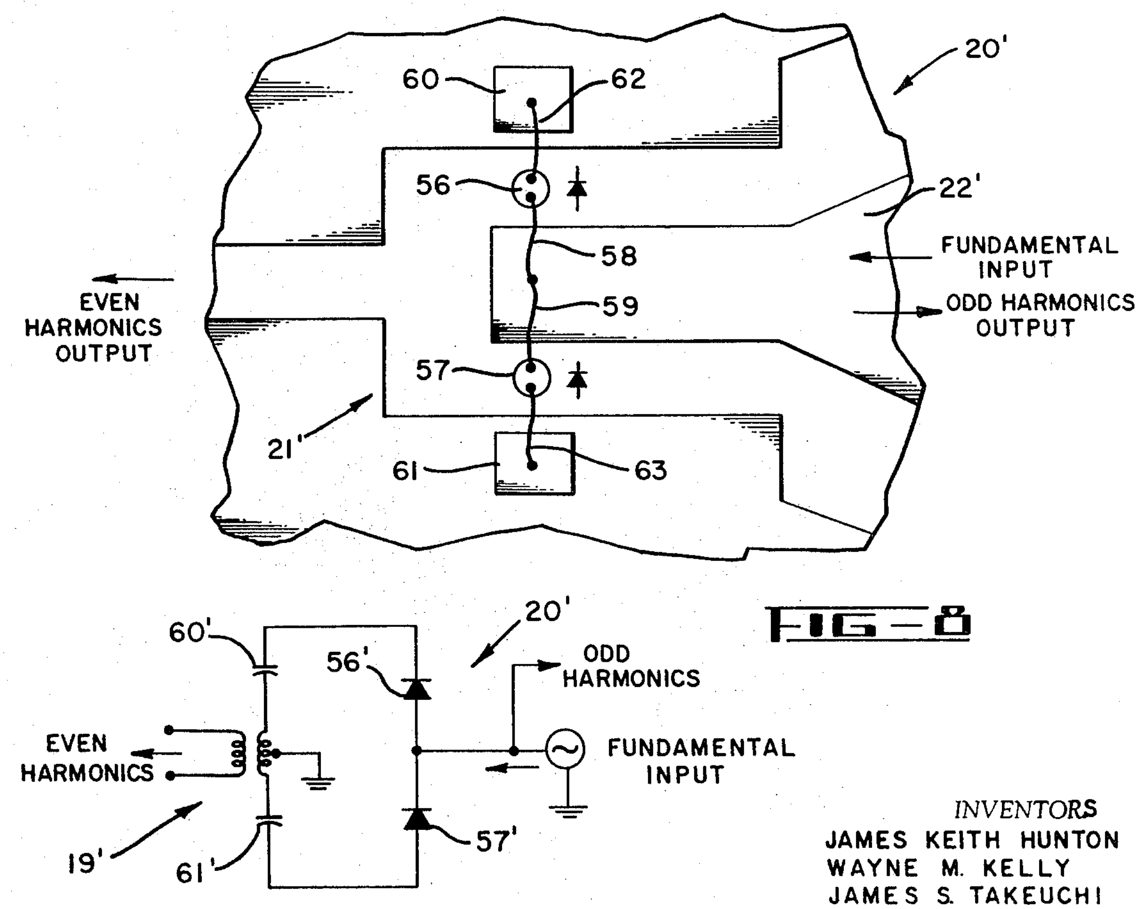
FIG. 8 is a plan view of the slot/coplanar line junction similar to FIG. 4 and modified to provide frequency multiplication.
FIG. 9 is a schematic diagram of an equivalent circuit representing the frequency multiplier of FIG. 8.

The planar balanced circuit concept described above in connection with balanced mixers is equally applicable to the realization of balanced frequency multipliers including doublers and quadruplers. This application of the invention is illustrated in FIG. 8 in which the junction 21' of slot line 19' and coplanar line 20' is substantially identical to that shown in FIGS. 1 and 4 described above except that varactor diodes 56 and 57 are connected across the junction instead of the Shottky barrier mixer diodes. Varactor diodes 56 and 57 are formed on the dielectric substrate at the junction as shown, and are connected with the polarities indicated by leads 58 and 59, respectively, directly to center strip 22' of the coplanar line and to opposite slides of slot line 19' by capacitors 60 and 61 via leads 62 and 63, respectively.

A particular advantage of such a balanced multiplier circuit is that the odd and even harmonics are separated with the odd harmonics appearing at the input port and the even harmonics at the output port. This provides substantially greater bandwidth in the operation of the multiplier circuit. It will be noted that the L.O. port of the circuit shown in FIG. 1 becomes the fundamental input port and the odd harmonic output port in the balanced multiplier whereas the R.F. signal port becomes the even harmonic output port. The I.F. port of the balanced mixer is eliminated while appropriate bias connections to the multiplier circuit are added. The equivalent circuit of the multiplier shown in FIG. 8 is illustrated in FIG. 9 with like parts designated by the primes of the reference characters. It should be noted that as in the balanced mixer circuit, the fundamental input port and the even harmonics output port may be reversed provided the polarity of one of the varactor diodes is also reversed.

What is claimed is:

1. A planar balanced circuit comprising
a plane dielectric substrate,
an electrically conductive film on one side of said substrate,
a slot transmission line formed along an axis on said side of the substrate,
a coplanar transmission line formed on said side of the substrate along an axis aligned with the slot line axis,
said slot and coplanar lines intersecting at a junction,
diode means connected across said coplanar line adjacent said junction,
means for energizing with electromagnetic waves at least one of said transmission lines remote from said junction whereby to impress an alternating voltage across said diode means, and
means for deriving across said diode means at least one output voltage having a frequency different from the frequency of said waves on said one of said transmission lines.

2. The circuit according to claim 1 in which said coplanar line comprises an axially extending center strip of said conductive film bounded by coextensive grooves in said film,
said junction comprising the intersection of said slot line with said grooves, the center strip being spaced from the inner end of the slot line.

3. The circuit according to claim 1 with a first coaxial input line connected to said slot line remote from said junction, the axis of the coaxial line being perpendicular to the axis of the slot line, and a second coaxial input line connected to said coplanar line remote from said junction with the axis of said second coaxial line coincident with the axis of the coplanar line.

4. A planar balanced circuit comprising
a plane dielectric substrate,
an electrically conductive film on one side of said substrate,
a slot transmission line formed along an axis on said side of the substrate,
a coplanar transmission line formed on said side of the substrate along an axis aligned with the slot line axis,
said slot and coplanar lines intersecting at a junction,
said coplanar line comprising and axially extending center strip of said conducted film bounded coextensive grooves in said film,
said junction comprising an intersection of said slot line with said grooves, the center strip being spaced from the inner end of the center of the slot line,
diode means connected across said coplanar line adjacent said junction,
said diode means comprising at least two diodes electrically coupled across said grooves, respectively, between said center strip and said conductive film on opposite sides of said groove,
means for energizing with electromagnetic waves at least one of said transmission lines remote from said junction whereby to impress an alternating voltage across said diodes, and means for deriving across said diodes at least one output voltage having a frequency different from the frequency of said waves on said one of said transmission lines.

5. The circuit according to claim 4 with two additional diodes similarly coupled across said grooves and electrically connected to said first named diodes in a series ring arrangement, the four diodes being mixer diodes, second means for energizing the other of said transmission lines with electromagnetic waves having a frequency different from that of the waves on said one transmission line, and means for deriving from the diode ring an electromagnetic wave signal having a frequency equal to the difference in frequency of the waves on the slot and coplanar transmission lines.

6. The circuit according to claim 4 in which said diodes are varactor diodes, the odd and even harmonics of the electromagnetic waves on said one transmission line being separated and directed away from said junction along said transmission lines, respectively.

7. A balanced microwave mixer circuit comprising a dielectric sheet having an electrically conductive film on one side, axially aligned slot and coplanar transmission lines formed from said film on said side of said sheet and intersecting at a junction, said coplanar line having a center strip and ground plane spaced from and on opposite sides of the center strip, means for coupling microwave input signals having different frequencies to said transmission lines, respectively, remote from said junction whereby said signals propagate therealong to said junction, at least two diode electrically connected across said coplanar line adjacent said junction, and an output transmission line connected across said junction whereby to carry an output electromagnetic wave signal having a frequency equal to the difference between the frequencies of said input signals.

8. A balanced microwave mixer circuit comprising a dielectric sheet having an electrically conductive film on one side, axially aligned slot and coplanar transmission lines formed from said film on said side of said sheet and intersecting at a junction, said coplanar line having a center strip and ground plane spaced from and one opposite sides of the center strip, means for coupling microwave input signals having different frequencies to said transmission lines, respectively, remote from said junction whereby said signals propagate therealong to said junction, at least two diodes electrically connected across said coplanar line adjacent said junction, one of the electrodes of each of said diodes coupled by capacitors to said center strip of the coplanar line and the remaining electrodes of said diodes being connected to the ground planes, respectively, and an output transmission line connected across said junction whereby to carry an output electromagnetic wave signal having a frequency equal to the difference between the frequencies of said input signals.

9. The circuit according to claim 8 in which said diodes and capacitors are integrated circuit components.

10. The circuit according to claim 9 with four diodes connected across said junction in a series ring arrangement.

11. A balanced microwave frequency multiplier circuit comprising a dielectric sheet having an electrically conductive film on one side, axially aligned slot and coplanar transmission lines formed on said one side of the sheet and intersecting at a junction, means for coupling to one of said transmission lines remote from said junction a source of a microwave signal having a fundamental frequency $f_1$, at least two varactor diodes electrically connected across said junction whereby to be biased by said coplanar line adjacent said microwave signal, and means for coupling from one of said transmission lines remote from said junction the even harmonics of said microwave signal.

12. The circuit according to claim 11 with means for coupling from the other of said transmission lines remote from said junction the odd harmonics of said microwave signal.

* * * * *